(12) United States Patent
Kunugi et al.

(10) Patent No.: US 6,578,406 B2
(45) Date of Patent: Jun. 17, 2003

(54) VAPOCHROMIC LED

(75) Inventors: Yoshihito Kunugi, Hiroshima (JP); Kent R. Mann, North Oaks, MN (US); Larry L. Miller, Minnetonka, MN (US); Christopher L. Exstrom, Kearney, NE (US)

(73) Assignee: Regents of the University of Minnesota, Minneapolis, MN (US)

( * ) Notice: Subject to any disclaimer, the term of this patent is extended or adjusted under 35 U.S.C. 154(b) by 33 days.

(21) Appl. No.: 10/010,478

(22) Filed: Nov. 5, 2001

(65) Prior Publication Data

US 2002/0042174 A1 Apr. 11, 2002

Related U.S. Application Data

(62) Division of application No. 09/638,269, filed on Aug. 14, 2000, now Pat. No. 6,338,977, which is a division of application No. 09/225,758, filed on Jan. 5, 1999, now Pat. No. 6,160,267.

(51) Int. Cl.$^7$ .............................. G01N 7/00; H01L 21/00
(52) U.S. Cl. .................... 73/31.05; 73/31.03; 73/31.06; 438/49; 438/29
(58) Field of Search ..................... 438/49, 29; 73/31.03, 73/31.06, 73, 31.05; 257/40, 103

(56) References Cited

U.S. PATENT DOCUMENTS

| 5,629,533 A | 5/1997 | Ackley et al. |
| 5,766,952 A | 6/1998 | Mann et al. |

OTHER PUBLICATIONS

C.L. Exstrom et al, "Inclusion of Organic Vapors by Crystalline, Solvatochromic [Pt(aryl isonitrile)$_4$][Pd(CN)$_4$] Compounds", *Chemical Materials*, vol. 7, pp. 15–17 (1995).

C.A. Daws et al, "Vapochromic Compounds as Environmental Sensors" *Chemical Materials*, vol. 9, pp. 363–368 (1997).

R.H. Friend, "Conjugated Polymers and Related Materials", W.R. Salaneck et al, Eds., Chapter 21, Oxford University Press (1993).

(List continued on next page.)

*Primary Examiner*—John F. Niebling
*Assistant Examiner*—Viktor Simkovic
(74) *Attorney, Agent, or Firm*—David W. Collins

(57) ABSTRACT

A sandwich device was prepared by electrodeposition of an insoluble layer of oligomerized tris(4-(2-thienyl)phenyl) amine onto conducting indium-tin oxide coated glass, spin coating the stacked platinum compound, tetrakis(p-decylphenylisocyano)platinum tetranitroplatinate, from toluene onto the oligomer layer, and then coating the platinum complex with aluminum by vapor deposition. This device showed rectification of current and gave electroluminescence. The electroluminescence spectrum ($\lambda_{max}$=545 nm) corresponded to the photoluminescence spectrum of the platinum complex. Exposure of the device to acetone vapor caused the electroemission to shift to 575 nm. Exposure to toluene vapor caused a return to the original spectrum. These results demonstrate a new type of sensor that reports the arrival of organic vapors with an electroluminescent signal. The sensor comprises (a) a first electrode; (b) a hole transport layer formed on the first electrode; (c) a sensing/emitting layer formed on the hole transport layer, the sensing/emitting layer comprising a material that changes color upon exposure to the analyte vapors; (d) an electron conductor layer formed on the sensing layer; and (e) a second electrode formed on the electron conductor layer. The hole transport layer emits light at a shorter wavelength than the sensing/emitting layer and at least the first electrode comprises an optically transparent material.

11 Claims, 4 Drawing Sheets

OTHER PUBLICATIONS

A.J. Heeger, "Conjugated Polymers and Related Materials", W.R. Salnaeck et al, Eds., Chapter 4, Oxford university Press (1993).

R.H. Friend et al, "Conjugated Polymer Electroluminescence", *Physical Properties of Polymers Handbook*, J.E. Mark, Ed., AIP Press, New York (1996).

Y. Yang, "Polymer Electroluminescent Devices", *MRS Bulletin*, pp 31–38 (Jun. 1997).

T. Tsutsui, "Progress in Electroluminescent Devices Using Molecular Thin Films", *MRS Bulletin*, pp. 39–45 (Jun. 1997).

W.R. Salaneck et al, "Conjugated Polymer Surfaces and Interfaces for Light–Emitting Devices", *MRS Bulletin*, pp. 46–51 (Jun. 1997).

C.L. Exstrom, "Structural Characterization of Iridium 1,8–Diisocyanomenthane Complexes and the Effects of Guest Molecule Inclusion on the Structure and Spectroscopy of Organometallic Stacking Materials", Ph.D. Dissertation, University of Minnesota, 1995.

Kunugi et al, "Light–emitting Diodes Based on Linear and Starburst Electro–Oligomerized Thienyltriphenylamines", *Synthetic Metals*, 89, pp. 227–229 (1997).

John P. Wheeler, "Light–Emitting Polymers Are Ready For Prime Time", *Photonics Spectra*, pp. 130–134, Apr. 1997.

Kunugi et al, "A Vapochromic LED", *J. A. Chem. Soc.,* vol. 120, pp. 589–590 (1998).

R = ⌬-C₁₀H₂₁, X = CN

R = ⌬-C₁₀H₂₁, X = NO₂

VAPOCHROMIC LED

CROSS-REFERENCE TO RELATED APPLICATION

The present application is a division of application Ser. No. 09/638,269, filed Aug. 14, 2000, now U.S. Pat. No. 6,338,977 issued Jan. 15, 2002, which in turn is a division of application Ser. No. 09/225,758, filed Jan. 5, 1999, now U.S. Pat. No. 6,160,267, issued Dec. 12, 2000.

ORIGIN OF INVENTION

This invention was made with government support under CHE-9216003 and CHE-9307837 awarded by the National Science Foundation and MIT/CC-S-588180/LITCO/DE (DOE Prime) awarded by the Massachusetts Institute of Technology. The government has certain rights in the invention.

TECHNICAL FIELD

The present invention relates generally to molecular electronics, and, more particularly, to vapor-sensitive, molecular light emitting diodes based on thin films of certain platinum complexes.

BACKGROUND ART

The inventors have recently published reports that have enucleated and explained the unusual "vapochromic" changes in absorption and emission spectra that result when certain stacked platinum complexes are exposed to organic vapors; see, e.g., C. L. Exstrom et al, *Chemical Materials*, Vol. 7, pp. 15–17 (1995) and C. A. Daws et al, *Chemical Materials*, Vol. 9, pp. 363–368 (1997).

A typical experiment involves a solution, crystal or solid film of material, such as tetrakis(p-decylphenylisocyano) platinum tetracyanoplatinate (I) (see FIG. 1, which depicts the chemical formula of the compound, where the dashed vertical line indicates the c-axis) that forms stacks of alternating cations and anions with strong interplatinum interactions. These salts exhibit an intense absorption band in the visible region. Exposing the stacks to small molecule vapors, such as acetone or chloroform, leads to sorption of the vapor molecules in the free volume between the stacks, and produces shifts in the absorption and emission spectra. These "vapochromic" or "vapoluminescent" changes are usually reversible so that the original spectrum is regained quickly after the vapor is removed. Such an effect has potential application for sensor technology.

Molecular LEDs are under intense investigation; see, e.g., R. H. Friend in *Conjugated Polymers and Related Materials*, W. R. Salaneck et al, Eds., Chapter 21, Oxford University Press (1993); A. J. Heeger, in Conjugated Polymers and Related Materials, W. R. Salaneck et al, Eds., Chapter 4, Oxford University Press (1993); R. H. Friend et al, in "Physical Properties of Polymers Handbook", J. E. Mark, Ed., AIP Press, New York (1996); Y. Yang, *MRS Bulletin*, pp. 31–38 (June 1997); T. Tsutsui, *MRS Bulletin*, p. 39–45 (June 1997); and W. R. Salaneck et al, *MRS Bulletin*, p. 46–51 (June 1997). However, to the best of the inventors' knowledge, there is only one unspecific report from the patent literature which describes this type of LED sensor; see, U.S. Pat. No. 5,629,533, issued to D. E. Ackley et al on May 13, 1997.

Vapochromic platinum complexes and salts have been the subject of a patent; see, U.S. Pat. No. 5,766,952, issued to Kent R. Mann et al on Jun. 16, 1998. Such complexes change color when exposed to certain organic vapors.

DISCLOSURE OF INVENTION

In accordance with the present invention, a molecular light emitting diode is provided. The molecular LED employs an organic complex that acts as both a sensor to certain organic molecules, or analyte vapors, and as an active light emitter. The molecular LED of the present invention comprises:

(a) a first electrode;

(b) a hole transport layer formed on the first electrode;

(c) a sensing/emitting layer formed on the hole transport layer, the sensing layer comprising a material that changes color upon exposure to the analyte vapors;

(d) an electron conductor layer formed on the sensing layer; and (e) a second electrode formed on the electron conductor layer, wherein the hole transport layer emits light at a shorter wavelength than the sensing/emitting layer and wherein at least the first electrode comprises an optically transparent material. The device is preferably formed on a transparent dielectric substrate, on which the first electrode is formed.

Also in accordance with the present invention, a method is provided for detecting analyte vapors. The method comprises:

(a) providing the above-described vapochromic LED;

(b) introducing the analyte vapors to the sensing layer; and (c) biasing the first electrode positive with respect to the second electrode.

Further in accordance with the present invention, methods are provided for forming the vapochromic LED.

Other objects, features, and advantages of the present invention will become apparent upon consideration of the following detailed description and accompanying drawings, in which like reference designations represent like features throughout the FIGURES. The drawings referred to in this description should be understood as not being drawn to scale except if specifically noted.

BEST MODES FOR CARRYING OUT THE INVENTION

Figure 1:
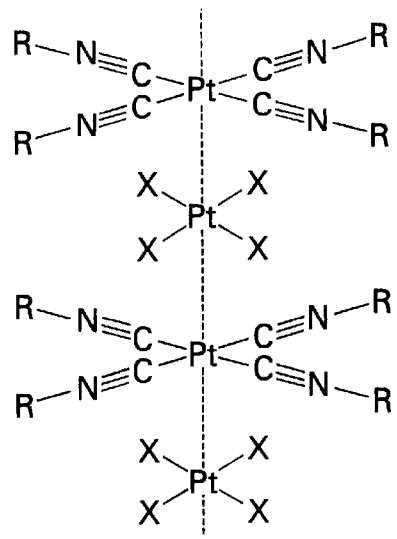
FIG. 1 depicts the basic formulae of certain platinum complexes employed in the practice of the present invention.
Figure 2A:
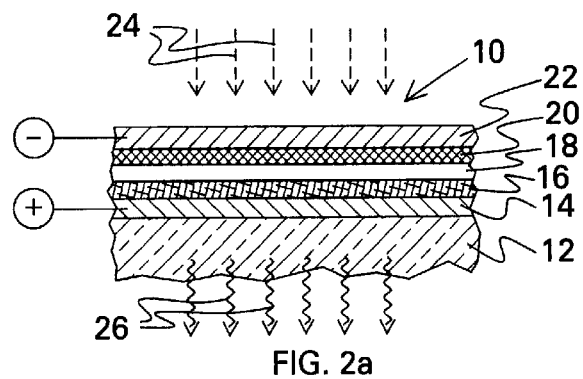
FIG. 2a depicts a molecular LED structure of the present invention, using three separate layers, one for hole transport, one for sensing/emitting, and one for electron conducting.

In accordance with the present invention, a vapochromic light emitting diode is provided, which is sensitive to certain organic vapors and emits optical radiation upon exposure to the organic vapor. Referring to FIG. 2a, the general structure of the LED 10 is formed on a substrate 12 and comprises:

(a) a first electrode 14 formed on the substrate;

(b) a hole transport layer 16 formed on the first electrode;

(c) a sensing/emitting layer 18 formed on the hole transport layer (d) an electron conductor layer 20 formed on the sensing/emitting layer; and (e) a second electrode 22 formed on the electron conductor layer.

The material comprising the substrate 12 comprises any optically transparent dielectric material having sufficient thickness and strength to support the layers formed thereover. An example of a suitable substrate material includes quartz.

The first electrode 14 comprises indium tin oxide (ITO) or polyaniline or other such material that is both electrically conductive and transparent in at least the optical region. For example, ITO is transparent from about 250 to 2600 nm. The deposition of the first electrode 14 on the substrate 12 is performed by any of the conventional techniques for these materials.

The hole transport layer 16 serves to move positive charge to the emitting/sensing layer 18. Hole transport materials are discussed in greater detail below. Such materials may be formed by vacuum deposition, chemical vapor deposition, spin-casting, and the like.

The sensing layer 18 changes color upon exposure to a chemical vapor 24 and emits light 26. For many sensing layer materials, the effect is reversible upon removal of the chemical vapor. That is, the color of the sensing layer 18 reverts to its original color. However, there are some sensing materials that do not exhibit this color reversal. Many of these sensing materials may be returned to their original color upon introduction of a second chemical vapor.

The electron conductor layer 20 serves to move electrons from the second electrode 22 to the sensing/emitting layer 18. Electron conductor materials that would be useful in the practice of the present invention are well-known to those skilled in this art; an example of such a material is aluminum tris(8-hydroxyquinoline). Such materials may be formed by vacuum deposition, chemical vapor deposition, spin-casting, and the like.

The second electrode 22 comprises an electrically conductive material, preferably a metal having a comparatively low work function, thus easily giving up electrons. Examples of such metals include aluminum, magnesium, calcium, indium, and silver or mixtures thereof. The deposition of the second electrode 22 on the electron conductor layer 20 is performed by any of the conventional-techniques for these materials.

Figure 2B:
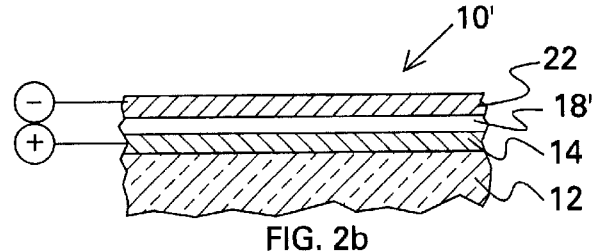
FIG. 2b depicts a preferred molecular LED structure of the present invention, using a double active layer configuration in which one layer performs two functions, namely hole transport and sensing/emitting.
Figure 2C:
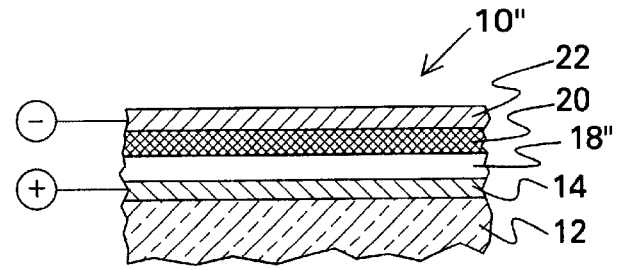
FIG. 2c depicts an alternative molecular LED structure of the present invention, in which one layer performs three functions, namely, hole transport, sensing/emitting, and electron conducting.

Two or more of the active layers (hole transport layer 16, sensing/emitting layer 18, and electron conductor layer 20) may be combined in a single layer. FIG. 2b depicts combining all three layers into a single layer 18', while FIG. 2c depicts combining the hole transport layer 16 and the sensing/emitting layer 18 into a single layer 18". The compositions of the active layers 16, 18, and 20 are discussed below.

In order to increase the efficiency of the LED 10 for sensing the chemical vapor, it is preferred that some means for introducing the chemical vapor to the sensing layer 18 be provided. Such means may comprise, for example, pinholes in the second electrode 22.

Because it is a better film-former than Compound I, the inventors chose to study tetrakis(p-decylphenylisocyano) platinum tetranitroplatinate (II) as the stacked platinum complex. This material, which serves as both the electron conductor layer 20 and the sensing layer 18, is also vapochromic as described above, except that unlike most vapochromic compounds, the color change does not reverse when the vapor is removed; se, e.g., C. L. Exstrom, Ph.D. Dissertation, University of Minnesota, 1995. The color can, however, be changed by introducing another vapor, and switched back and forth in a reversible manner with the sequential use of two different vapors; see, e.g., Exstrom, supra. Examples of vapors useful for switching the color back include alcohols, specifically, methanol, ethanol, and 2-propanol, diethyl ether, hexane, and acetonitrile.

In principle, the device 10, 10', 10" of the present invention is sensitive to any molecules which can penetrate the sensing/emitting layer 18, 18', 18". However, in practice, larger molecules are not as detectable as smaller molecules. In particular, the device is measurably sensitive to simple organic molecules, such as methanol, ethanol, iso-propanol, diethyl ether, acetonitrile, hexane, acetone, benzene, dichloromethane, and chloroform, as well as to simple inorganic molecules, such as water vapor and ammonia, to name a few. The sensitivity of the device is limited only by the same factors that limit the vapochromic effect in general. Concentrations on the order of high parts per billion (ppb) have been detected, and it is expected that optimized devices will be able to detect concentrations down to the low ppb region.

Compound II was prepared from a mixture of p-decylphenylisonitrile, cis[n-$(CH_3CN)_2PtCl_2$ and [n-$C_4H_9)_4$ N][Pt$(NO_2)_4$ in acetonitrile. The purified product gave appropriate combustion analysis and spectroscopic data.

In the present study, the quantum yield for photoluminescence (PL) from a thin film of Compound II was 3.8% (excited at 438 nm, measured at 540 nm). Devices were prepared by spin-casting Compound II from toluene onto ITO (indium-tin oxide) coated glass, followed by vapor deposition of aluminum to provide a single layer device, comprising ITO/Compound II/Al, which turned out to be very resistive, unstable, and did not show rectification.

Spin-casting of Compound II is conveniently performed using toluene as the spin-coating solvent.

No electroluminescence (EL) was observed for Compound II in the single layer device before electrical breakdown. The presence of electroluminescence before electrical breakdown would mean that the electrical properties (i.e., hole or electron conduction) of the material were not appropriate to form a LED by itself.

Recently, the inventors have shown that it is possible to form single layer LEDs, comprising ITO/Compound IV/Al, by anodically oligomerizing tris(p-thienylphenyl)amine (Compound III), to form Compound IV; see, Y. Kunugi, *Synthetic Metals,* Vol. 89, pp. 227–229 (1997): Compound IV is not a vapochromic material, but does emit light at a constant wavelength. The structure of this single layer LED is that depicted in FIG. 2*b;* it will be noted that this is an emitting device only, in which Compound IV performs the functions of hole transport and electron conductor, as well as emitting. The device of FIG. 2*b* is capable of sensing vapors only if the layer 18" comprises a vapochromic material, as well as performing the hole transport and electron conductor functions.

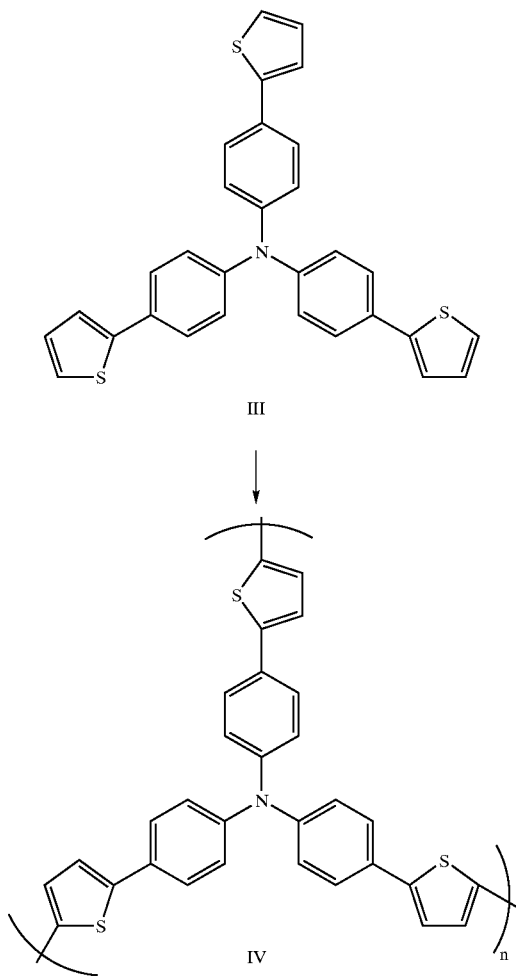

where n is of a value sufficient to form a cross-linked, insoluble polymer.

Because the layer of Compound IV is insoluble in solvents such as toluene, it seemed possible to spin-cast a second layer of Compound II on top of Compound IV without layer interdiffusion. In this way, Compound TV could be used as a hole transport layer to make a two-layer device. This approach succeeded when the inventors prepared ITO/Compound IV/Alq$_3$/Al, using the well-known emitter, aluminum tris(8-hydroxyquinoline). Here, the inventors prepared the two-layer device ITO/Compound IV/Compound II/Al by electrooligomerizing Compound III (700 nm layer of Compound IV) onto ITO, spin-coating Compound II from toluene (200 nm layer of Compound II), and vapor depositing aluminum (200 nm). As described above, the electrooligomerization was performed by oxidizing Compound III in acetonitrile, lithium perchlorate providing the oxidized form of Compound IV, and then reducing it to form the neutral Compound IV. The amount of Compound IV on the surface was estimated coulometrically and spectroscopically. FIG. 2*c* depicts this two active layer device 10", which is essentially the same as that of FIG. 2*a,* except that the thin film 18" of Compound II serves as both the sensing layer and the electron conductor layer. Compound IV is the hole conducting layer 20.

Figure 3:
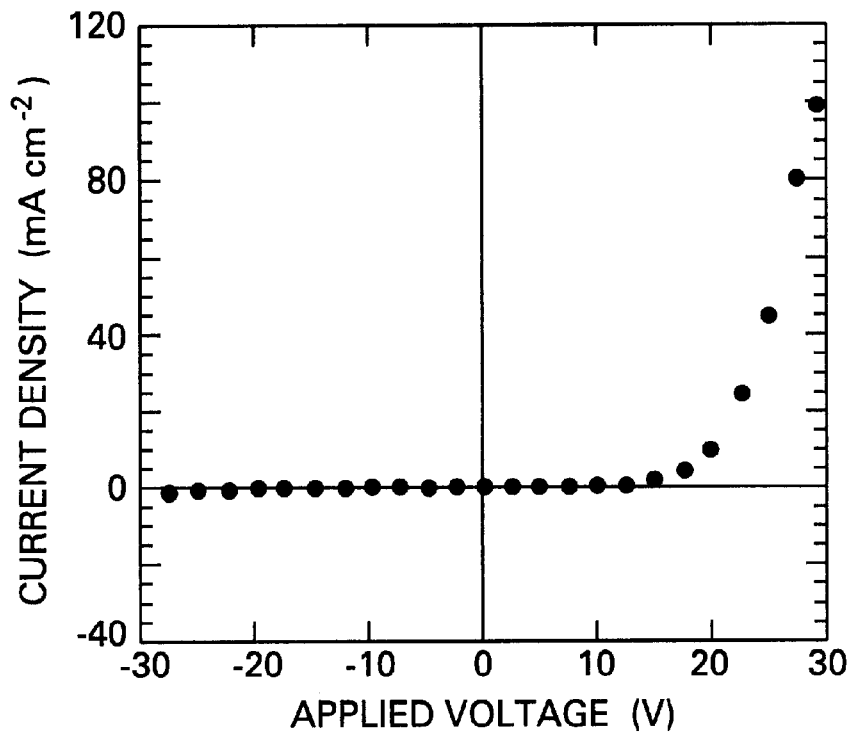
FIG. 3, on coordinates of current density (in $mA/cm^2$) and applied voltage (in V), is a plot of the current-voltage characteristics of a specific combination of hole transport layer and sensing layer, sandwiched between ITO and Al electrodes, where the sensing/emitting layer has the structure depicted in FIG. 1 and R=Ph—$C_{10}H_{21}$ and X=$NO_2$ (Compound II)
Figure 4:
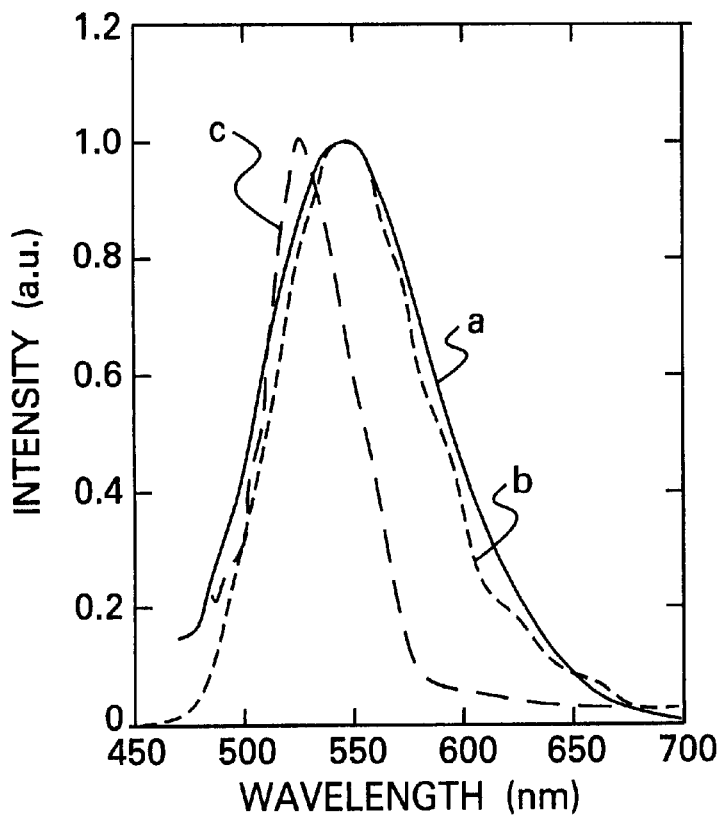
FIG. 4, on coordinates of intensity (in arbitrary units) and wavelength (in nm), is a plot depicting (a) the photoluminescence (PL) spectrum of the same sensing compound as measured in FIG. 3, (b) the electroluminescence (EL) spectrum of the sensing/emitting compound of FIG. 3, and (c) the PL spectrum of an oligomer of tris(p-thienylphenyl)amine (Compound IV)
Figure 5:
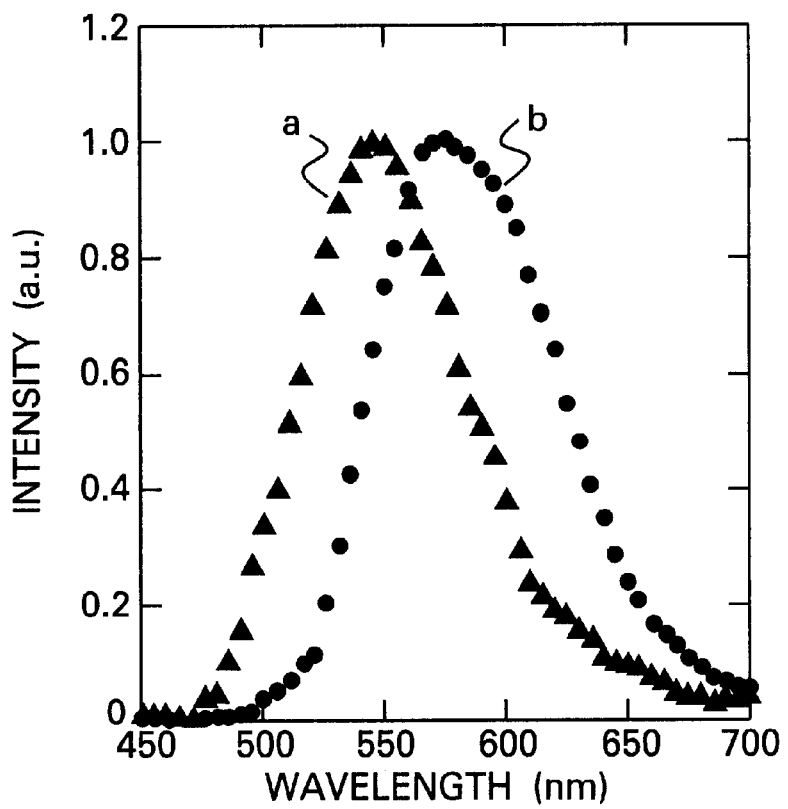
FIG. 5, on coordinates of intensity (in arbitrary units) and wavelength (in nm), is a plot depicting the EL spectra of ITO/Compound IV/Compound IV/Al (a) before and (b) after exposure to acetone vapor.

The device ITO/Compound IV/Compound II/Al (2 mm diameter) gave rectification of the applied current (FIG. 3) favoring electron flow from Al through the molecular layers to ITO. The EL spectrum corresponded closely to the PL spectrum of Compound II cast from toluene onto ITO ($\lambda_{max}$ 540 nm, FIG. 4). The current/EL intensity curve was nearly linear up to 25 V and we estimate that the photon/electron efficiency is about 0.01%. When the device was exposed to argon saturated with acetone vapor, the EL spectrum chanced dramatically to $\lambda_{max}$ 575 (FIG. 5). This spectrum is quite different from the PL spectrum of Compound IV. Thus, it appears that the EL comes primarily from Compound II, not Compound IV, which emits at lower wavelength. If the device is left at zero current for several days, open to the room atmosphere, no change in the spectrum is seen. Exposure of the device to toluene vapor in argon causes the spectrum to revert to the original.

Figure 6:
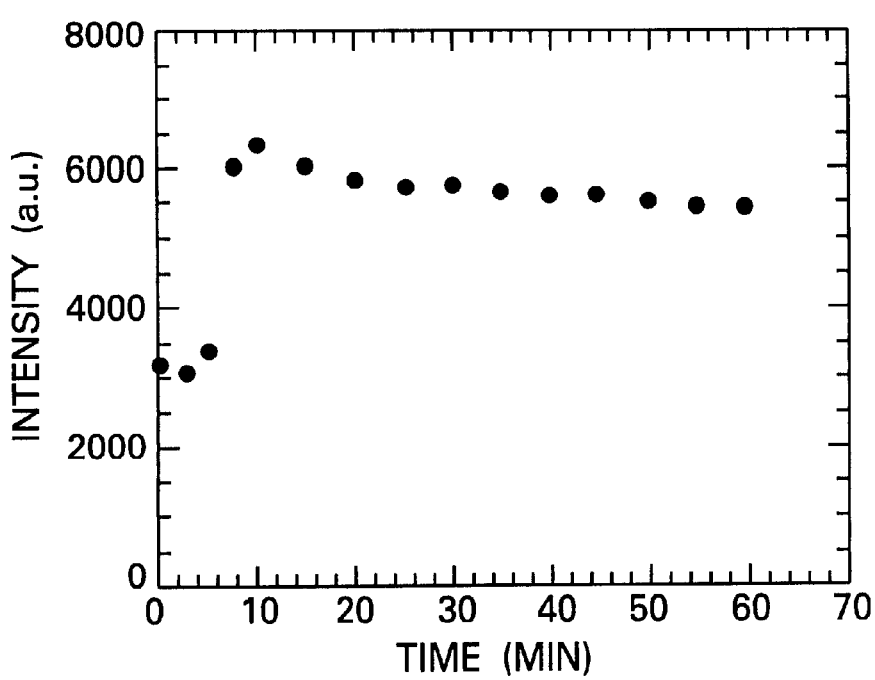
FIG. 6, on coordinates of intensity (in arbitrary units) and wavelength (in nm), is a plot depicting the time dependence of the EL at 600 nm after exposure to acetone vapor at time zero.

Molecular LEDs are often not very stable when they are in use, especially in air. Use as a sensor, however, only requires that the device be occasionally pulsed. Using a 1 mA cm$^{-2}$, 3 sec pulse every 5 min gives a stable emission intensity for an hour. When acetone vapor in argon was introduced, the spectrum did not change for about 5 min, but then quickly shifted to the longer wavelength (FIG. 6). Since there is no evidence that the color changes from the outside diameter of the device moving inward, and because the rate of change is independent of the diameter of the device, we hypothesize that the acetone penetrates through the thin aluminum film 14, which, due to its thinness, probably has pinholes. This is consistent with the sudden change of the color after a few minutes (as the acetone diffusion front reaches the molecular layers and rapidly diffuses into them, changing the structure and EL spectrum).

These preliminary results suggest that it will be possible to have a device of this type report on the arrival of certain vapors with a pulse of light. Since different organic vapors elicit different optical responses, a variety of chemicals can be detected. Using reversible examples of stacked complexes may provide the possibility of quantifying the response, and using alternative device geometries should improve the response time.

Other hole transport layers 16 include materials such as poly(p-phenylene vinylene) (PPV) polymers of symmetric and asymmetric triaryl amines, such as 4,4'-bis(phenyl-m-tolylamino) biphenyl (TPD), oligothiophenes with diaryl amino substituents, such as 2,5-bis{4-[bis(4-methylphenyl) amino]phenyl}thiophene (BMA-1T), 5,5'-bis{4-[bis(4-methyl-phenyl) amino]phenyl}-2,2'-bithiophene (BMA- 2T), 5,5"-bis{4-[bis(4-methylphenyl)amino]-phenyl}-2, 2':5',2"-ter thiophene (BMA-3T), and 5,5'''-bis{4-[bis(4-methylphenyl)amino]-phenyl}-2,2':5',2":5",2'''-quaterthiophene (BMA-4T). Still other hole transport materials are well-known in this art, and may be used in the practice of the present invention.

The sensing/emitting layer 18 must have the characteristics of emitting layers of conventional LEDs plus the vapochromic properties needed for color change. There are other active sensing/emitting layers 18 that are also known that allow the analyte molecules (organic vapor) to penetrate the lattice and induce a solvatochromic shift. Examples of such active emitting layers 18 are disclosed, e.g., in U.S. Pat. No. 5,766,952, and include (I) neutral platinum complexes comprising platinum complexed by four ligands wherein two ligands are negatively charged groups selected from the group consisting of $CN^-$, $NO_2^-$, $NCO^-$, $NCS^-$, $Cl^-$, $Br^-$, $I^-$, and oxalate and the remaining two ligands are selected from the group of at least one and at most two arylisonitrile groups and a Fisher carbene (i.e., (C(Y)=NH—$C_6H_4$-alkyl group), wherein Y can be O-alkyl, NH-alkyl, or N(alkyl)$_2$, including (a) Pt(CN—$C_6H_4$-alkyl group)$_2X_2$, (b) Pt(CN—$C_6H_4$-alkyl group)(C(Y)=NH—$C_6H_4$-alkyl group)$X_2$, and (II) double-complex salts represented by the general formulae (a) [Pt(CN—$C_6H_4$-alkyl group)$_4$][PtX$_4$], (b) [Pt(Phen)(CN—$C_6H_4$-alkyl group)$_2$][PtX$_4$] and (c) Pt(bpy)(CN—$C_6H_4$-alkyl group)$_2$][PtX$_x$], where alkyl group comprises an alkyl group of at least 4 carbon atoms, X is selected from the group consisting of $CN^-$, $NO_2^-$, $NCO^-$, $NCS^-$, and ½ oxalate, Phen is 1,10-phenanthroline or an alkyl-substituted phenanthroline and bpy is 2,2'-bipyridine or an alkyl-substituted bipyridine. Further examples of suitable vapochromic materials include tetra-alkyl metallo porphyrins with para substituents, such as hydrogen and $C_1$ to $C_{10}$ alkyl. Yet additional examples include salts of the anion [Ru(bipyridine)(CN)$_4$]$_2$, suitable substituted oligothiophenes with large substituents, and organic dye molecules that are solvatochromic and have solvent-permeable crystal lattices.

Figure 7:
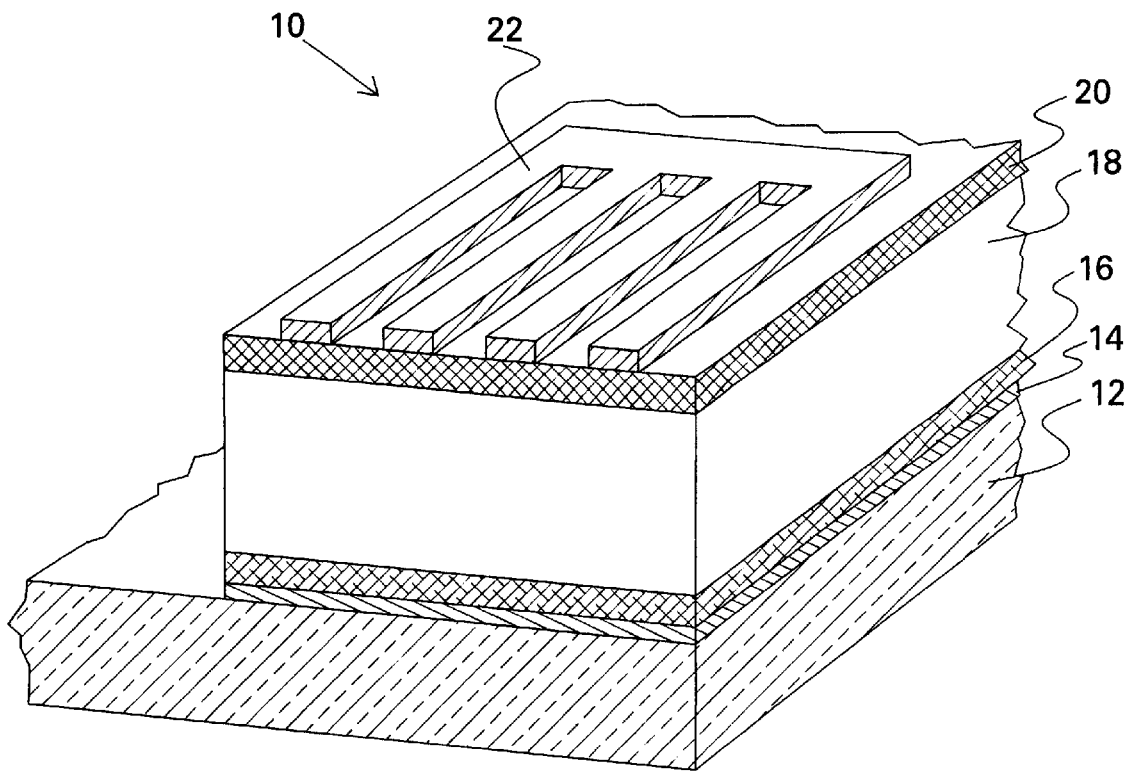
FIG. 7 is a perspective view of the device of FIG. 2a, but showing digitation of the top electrode to expose portions of an underlying layer.

The second electrode 22 may be a unitary layer, as shown in FIGS. 2a–2c, or may be digitated, as shown in FIG. 7, to expose the underlying layer (18' or 20, as the case may be). Such a configuration provides an alternative to relying on a thin conducting electrode with pinholes for introducing the vapor to be detected to the sensing/emitting layer 18 (or 18' or 18").

Figure 8:
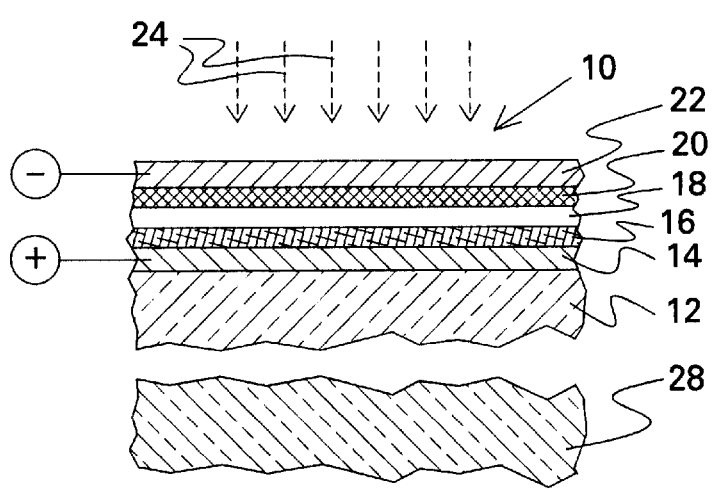
FIG. 8 is a side elevational view, depicting light emitted from the sensing/emitting layer coupled through the substrate into an optical fiber for transmission to a remote site.

Light emitted from the sensing/emitting layer 18 (or 18' or 18") may be coupled through the substrate 12 into an optical fiber 28 for transmission to a remote site. FIG. 8 depicts such a configuration.

Detection of color emitted by the device 10 may be done by the human eye or by any other color-discriminating sensor. Such color-discriminating sensors are well-known in the art.

Figure 9:
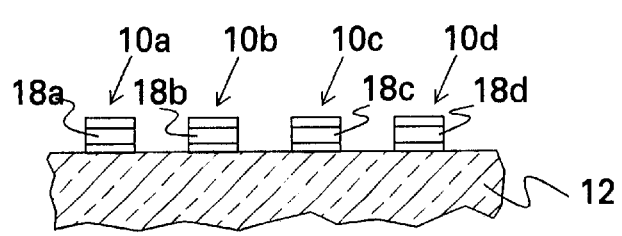
FIG. 9 depicts a side elevational view of a plurality of devices formed on the substrate, where each device formed with a different vapochromic compound.

More than one device 10 (four such devices 10a, 10b, 10c, 10d are shown) may be formed on the substrate 12, each device formed with a different vapochromic compound 18 (e.g., 18a, 18b, 18c, 18d), to permit identification of a mixture of vapors FIG.9 depicts this configuration.

Industrial Applicability

The molecular LED disclosed herein is expected to find use in moleular devices, particularly as sensors.

Thus, there has been disclosed a molecular light emitting diode. It will be appreciated by those skilled in this art that various changes and modifications of an obvious nature may be made, and all such changes and modifications are considered to fall within the scope of the invention, as defined by the appended claims.

What is claimed is:

1. A method for detecting analyte vapors comprising:
   (a) providing a vapochromic light emitting diode comprising
      (1) a first electrode,
      (2) a hole transport layer formed on said first electrode,
      (3) a sensing/emitting layer formed on said hole transport layer, said sensing/emitting layer consisting essentially of a homogeneous crystalline organic complex material that changes color from a first color to a second color upon exposure to said analyte vapors and is reversible back to said first color upon removal of said analyte vapors or upon exposure of said sensing/emitting layer to a different analyte,
      (4) an electron conductor layer formed on said sensing/emitting layer, and
      (5) a second electrode formed on said electron conductor layer, wherein said hole transport layer emits light at a shorter wavelength than said sensing/emitting layer and wherein at least said first electrode comprises an optically transparent material;
   (b) introducing said analyte vapors to said sensing/emitting layer; and
   (c) biasing said first electrode positive with respect to said second electrode.

2. The method of claim 1 further including means for introducing said analyte vapors to said sensing/emitting layer.

3. The method of claim 1 wherein said vapochromic light emitting diode further includes a substrate on which said diode is formed, with said first electrode formed on said substrate.

4. The method of claim 1 wherein said first electrode comprises an optically transparent material selected from the group consisting of indium tin oxide and polyaniline.

5. The method of claim 1 wherein said hole transport layer serves to move positive charge to said sensing/emitting layer.

6. The method of claim 1 wherein said electron conductor layer serves to move electrons from said second electrode to said sensing/emitting layer.

7. The method of claim 1 wherein said second electrode comprises a metal selected from the group consisting of aluminum, magnesium, calcium, and silver.

8. The method of claim 1 wherein said electron conductor layer and said sensing/emitting layer are one and the same layer to form a combined layer.

9. The method of claim 1 further including detecting light emitted by said sensing/emitting layer.

10. The method of claim 1 wherein said hole transport layer is selected from the group consisting of tetrakis(p-decylphenylisocyano)platinum tetranitroplatinate (II), oligomerized tris(p-thienylphenyl)amine, poly(p-phenylene vinylene) polymers of symmetric and asymmetric triaryl amines, including 4,4'-bis(phenyl-m-tolylamino)biphenyl (TPD), oligothiophenes with diaryl amino substituents, including 2,5-bis{4-[bis(4-methylphenyl)-amino]phenyl}thiophene, 5,5'-bis{4-[bis(4-methylphenyl)amino]phenyl}-2,2'-bithiophene, 5,5"-bis{4-[bis(4-methylphenyl)amino]phenyl}-2,2':5',2"-ter thiophene, and 5,5'''-bis{4-[bis(4-methylphenyl)amino]phenyl}-2,2':5',2":5",2'''-quarterthiophene.

11. The method of claim 1 wherein said sensing/emitting layer is selected from the group consisting of (I) neutral platinum complexes comprising platinum complexed by four ligands wherein two ligands are negatively charged groups selected from the group consisting of $CN^-$, $NO_2^-$, $NCO^-$, $NCS^-$, $Cl^-$, $Br^-$, $I^-$, and oxalate and the remaining two ligands are selected from the group of at least one and at most two arylisonitrile groups and a Fisher carbene having the formula $C(Y)=NH-C_6H_4$-alkyl group, wherein Y can be O-alkyl, NH-alkyl, or $N(alkyl)_2$, including (a) $Pt(CN-C_6H_4$-alkyl group$)_2X_2$, (b) $Pt(CN-C_6H_4$-alkyl group)$(C(Y)=NH-C_6H_4$-alkyl group$)X_2$; (II) double-complex salts represented by the general formulae (a) [Pt$(CN-C_6H_4$-alkyl group$)_4$][$PtX_4$], (b) [Pt(Phen)(CN—$C_6H_4$-alkyl group$)_2$][$PtX_4$] and (c) Pt(bpy)(CN—$C_6H_4$-alkyl group$)_2$][$PtX_x$], where alkyl group comprises an alkyl group of at least 4 carbon atoms, X is selected from the group consisting of $CN^-$, $NO_2^-$, $NCO^-$, $NCS^-$, and ½ oxalate, Phen is 1,10-phenanthroline or an alkyl-substituted phenanthroline and bpy is 2,2'-bipyridine or an alkyl-substituted bipyridine; (III) tetra-alkyl metallo porphyrins with para substituents, including hydrogen and $C_1$ to $C_{10}$ alkyl; (IV) salts of the anion [Ru(bipyridine)$(CN)_4]_2$; (V) substituted oligothiophenes with large substituents; and (VI) organic dye molecules that are solvatochromic and have solvent-permeable crystal lattices.

* * * * *